(12) United States Patent
Yates

(10) Patent No.: US 7,384,727 B2
(45) Date of Patent: Jun. 10, 2008

(54) SEMICONDUCTOR PROCESSING PATTERNING METHODS

(75) Inventor: Donald L. Yates, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 85 days.

(21) Appl. No.: 10/609,311

(22) Filed: Jun. 26, 2003

(65) Prior Publication Data

US 2004/0265746 A1    Dec. 30, 2004

(51) Int. Cl.
*G03F 7/26* (2006.01)

(52) U.S. Cl. .................. 430/313; 430/311

(58) Field of Classification Search ........... 430/311, 430/312, 313, 322
See application file for complete search history.

(56) References Cited

U.S. PATENT DOCUMENTS

| | | | |
|---|---|---|---|
| 3,349,474 A | | 10/1967 | Rauscher .............. 438/10 |
| 3,772,101 A | * | 11/1973 | Chumbres et al. ........ 216/18 |
| 3,934,057 A | * | 1/1976 | Moreau et al. ........... 430/5 |
| 4,086,074 A | | 4/1978 | Minot et al. ............. 438/61 |
| 4,180,596 A | | 12/1979 | Crowder et al. .......... 427/42 |
| 4,622,735 A | | 11/1986 | Shibata ................. 438/303 |
| 4,645,562 A | * | 2/1987 | Liao et al. ............. 438/640 |
| 4,683,645 A | | 8/1987 | Naguib et al. .......... 438/530 |
| 4,693,910 A | | 9/1987 | Nakajima et al. ........ 257/647 |
| 4,766,090 A | | 8/1988 | Coquin et al. .......... 438/222 |
| 5,099,304 A | | 3/1992 | Takemura et al. ........ 427/168 |
| 5,236,865 A | | 8/1993 | Sandhu et al. .......... 438/297 |
| 5,275,695 A | * | 1/1994 | Chang et al. ............ 216/27 |
| 5,406,123 A | | 4/1995 | Narayan ............... 257/767 |
| 5,444,024 A | | 8/1995 | Anjum et al. ........... 438/143 |
| 5,470,784 A | | 11/1995 | Anjum et al. ........... 65/31 |
| 5,470,794 A | | 11/1995 | Anjum et al. ........... 437/200 |
| 5,670,298 A | | 9/1997 | Hur .................... 430/318 |
| 5,677,102 A | * | 10/1997 | Shiihara ............... 430/168 |
| 5,904,517 A | | 5/1999 | Gardner et al. ......... 438/197 |
| 5,955,244 A | | 9/1999 | Duval ................. 430/314 |

(Continued)

FOREIGN PATENT DOCUMENTS

EP    0 851 473 A2    1/1998

(Continued)

OTHER PUBLICATIONS

Chang et al., Silicon surface treatments in advanced MOS gate processing, Microelectronic Engineering, (2004), pp. 130-135.

(Continued)

*Primary Examiner*—Kathleen Duda
(74) *Attorney, Agent, or Firm*—Wells St. John P.S.

(57) ABSTRACT

The invention includes semiconductor processing patterning methods and semiconductor constructions. A semiconductor processing patterning method includes forming a second composition resist layer over a different first composition resist layer. Overlapping portions of the first and second composition resist layers are exposed to actinic energy effective to change solubility of the exposed portions versus the unexposed portions of each of the first and second composition resist layers in a developer solution. The first and second composition resist layers are developed with the developer solution under conditions effective to remove the exposed portions of the first composition resist layer at a faster rate than removing the exposed portions of the second composition resist layer. Additional aspects and implementations are contemplated.

21 Claims, 4 Drawing Sheets

U.S. PATENT DOCUMENTS

| | | | |
|---|---|---|---|
| 5,994,194 A | 11/1999 | Lammert | 438/319 |
| 5,998,264 A | 12/1999 | Wu | 438/260 |
| 6,013,582 A | 1/2000 | Ionov et al. | 438/738 |
| 6,037,239 A | 3/2000 | Jennings | 438/430 |
| 6,096,621 A | 8/2000 | Jennings | 438/404 |
| 6,096,634 A * | 8/2000 | Nguyen | 438/624 |
| 6,130,140 A | 10/2000 | Gonzalez | 438/430 |
| 6,133,105 A | 10/2000 | Chen et al. | 438/296 |
| 6,133,116 A | 10/2000 | Kim et al. | 438/430 |
| 6,156,674 A | 12/2000 | Li et al. | 438/780 |
| 6,165,834 A | 12/2000 | Agarwal et al. | 438/240 |
| 6,169,019 B1 | 1/2001 | Takagi | 438/597 |
| 6,177,235 B1 | 1/2001 | Francou et al. | 430/313 |
| 6,180,465 B1 | 1/2001 | Gardner et al. | 438/291 |
| 6,188,097 B1 | 2/2001 | Derderian et al. | 257/306 |
| 6,207,485 B1 | 3/2001 | Gardner et al. | 438/216 |
| 6,238,994 B1 | 5/2001 | Derdeian et al. | 439/398 |
| 6,255,035 B1 * | 7/2001 | Minter et al. | 430/312 |
| 6,277,709 B1 | 8/2001 | Wang et al. | 438/430 |
| 6,277,728 B1 | 8/2001 | Ahn et al. | 438/619 |
| 6,281,100 B1 | 8/2001 | Yin et al. | 438/585 |
| 6,291,363 B1 | 9/2001 | Yin et al. | 438/769 |
| 6,297,527 B1 | 10/2001 | Agarwal et al. | 257/306 |
| 6,350,560 B1 | 2/2002 | Sahbari | 430/325 |
| 6,376,149 B1 * | 4/2002 | Grober et al. | 430/139 |
| 6,380,611 B1 | 4/2002 | Yin et al. | 257/649 |
| 6,383,723 B1 | 5/2002 | Iyer et al. | 430/327 |
| 6,399,982 B1 | 6/2002 | Derderian et al. | 257/309 |
| 6,440,793 B1 | 8/2002 | Divakaruni et al. | 438/243 |
| 6,465,325 B2 | 10/2002 | Ridley et al. | 438/428 |
| 6,511,896 B2 | 1/2003 | Basceri et al. | 438/459 |
| 6,548,854 B1 | 4/2003 | Kizilyalli et al. | 257/310 |
| 6,582,861 B2 | 6/2003 | Buxbaum et al. | 430/5 |
| 6,582,888 B1 * | 6/2003 | Herbst et al. | 430/312 |
| 6,608,343 B2 | 8/2003 | Derderian et al. | 257/309 |
| 6,613,240 B2 * | 9/2003 | Skinner et al. | 216/38 |
| 6,617,250 B2 | 9/2003 | Basceri et al. | 438/689 |
| 6,649,466 B2 | 11/2003 | Basceri et al. | 438/240 |
| 6,720,638 B2 | 4/2004 | Tran | 257/499 |
| 6,744,093 B2 | 6/2004 | Agarwal et al. | 257/306 |
| 6,746,916 B2 | 6/2004 | Agarwal et al. | 438/253 |
| 6,753,618 B2 | 6/2004 | Basceri et al. | 257/915 |
| 6,777,739 B2 | 8/2004 | Agarwal et al. | 257/306 |
| 6,780,728 B2 | 8/2004 | Tran | 438/243 |
| 6,780,766 B2 | 8/2004 | Basceri et al. | 430/676 |
| 6,817,086 B2 * | 11/2004 | Lu et al. | 29/603.15 |
| 6,838,363 B2 | 1/2005 | Wieczorek et al. | 438/528 |
| 6,844,131 B2 | 1/2005 | Oberlander et al. | 430/270.1 |
| 6,900,497 B2 | 5/2005 | Agarwal et al. | 257/306 |
| 6,943,126 B1 | 9/2005 | Narayanan et al. | 438/784 |
| 6,956,980 B2 | 10/2005 | Nagata et al. | 385/2 |
| 7,026,243 B2 | 4/2006 | Basceri | 438/682 |
| 2001/0006759 A1 | 7/2001 | Shipley, Jr. et al. | 430/280.1 |
| 2002/0076879 A1 | 6/2002 | Lee et al. | 438/241 |
| 2002/0196651 A1 | 12/2002 | Weis | 365/100 |
| 2003/0013272 A1 | 1/2003 | Hong et al. | 438/437 |
| 2003/0045060 A1 | 3/2003 | Ahn et al. | 438/287 |
| 2003/0045078 A1 | 3/2003 | Ahn et al. | 438/585 |
| 2003/0205729 A1 | 11/2003 | Basceri et al. | 257/200 |
| 2003/0211729 A1 * | 11/2003 | Lee et al. | 438/637 |
| 2003/0213987 A1 | 11/2003 | Basceri et al. | 257/296 |
| 2003/0219942 A1 | 11/2003 | Choi et al. | 438/253 |
| 2004/0043228 A1 | 3/2004 | Derderian et al. | 428/446 |
| 2004/0046197 A1 | 3/2004 | Basceri et al. | 257/296 |
| 2004/0219736 A1 | 11/2004 | Yoshitaka | 438/222 |
| 2004/0245559 A1 | 12/2004 | Pontoh et al. | 257/306 |
| 2004/0245560 A1 | 12/2004 | Pontoh et al. | 257/309 |
| 2005/0035460 A1 | 2/2005 | Tseng | 257/760 |
| 2005/0244571 A1 | 11/2005 | Walheim et al. | 427/162 |
| 2005/0266619 A1 | 12/2005 | Brask et al. | 438/151 |
| 2006/0183277 A1 | 8/2006 | Brask et al. | 438/197 |

FOREIGN PATENT DOCUMENTS

| | | | |
|---|---|---|---|
| JP | 2002-323775 | * | 11/2002 |

OTHER PUBLICATIONS

Lemberger et al., Electrical characterization and reliability aspects of zirconium silicate films obtained from novel MOCVD precursors, Microelectronic Engineering (2004), pp. 315-320.

Lu et al., Effects of the TaN$_x$ interface layer on doped tantalum oxide high-$k$ films, Vacuum (2004), pp. 1-9.

Robertson et al., Atomic structure, band offsets, growth and defects at high-$K$ oxide:Si enterfaces, Microelectronic Engineering (2004) pp. 112-120.

Singh et al., High and Low Dielectric Constant Materials, The Electrochemical Society *Interface*, Summer 1999, pp. 26-30.

Abstract: Basceri et al., Atomic Layer Deposition for Nanoscale CU Metalization, 10 pages (pre-Apr. 2004).

En et al., Plasma immersion ion implantation reactor design considerations for oxide charging, 85 Surface and Coatings Technology 64-69 (1966).

Ku et al., The Application of Ion Beam Mixing, Doped Silicide, and Rapid Thermal Processing of Self-Aligned Silicide Technology, 137 J. Electrochem. Soc. No. 2, pp. 728-740 (Feb. 1990).

Abstract: How to Eliminate Voiding in Porous-Low-k Dielectrics and The Mechanism of Void Formation; Lin et al.; 4 pages.

COB Stack DRAM Cell Technology beyond 100 nm Technology Node; Yongjik Park & Kinam Kim; pp. 349.1-349.3.

Rubin et al., Shallow-Junction Diode Formation by Implantation of Arsenic and Boron Through Titanium-Silicide Films and . . . , 17 IEEE Transactions on Electron Devices, No. 1, pp. 183-190 (Jan. 1990).

U.S. Appl. No. 10/655,997, filed Sep. 2003, Daley.
U.S. Appl. No. 10/689,958, filed Oct. 2003, Basceri.
U.S. Appl. No. 10/690,029, filed Oct. 2003, Derderian et al.
U.S. Appl. No. 10/882,118, filed Apr. 2004, Sandhu et al.
U.S. Appl. No. 10/879,367, filed Jun. 2004, Blalock et al.
U.S. Appl. No. 10/932,218, Basceri et al.
U.S. Appl. No. 10/822,118, filed Apr. 2004, Sandhu et al.

* cited by examiner

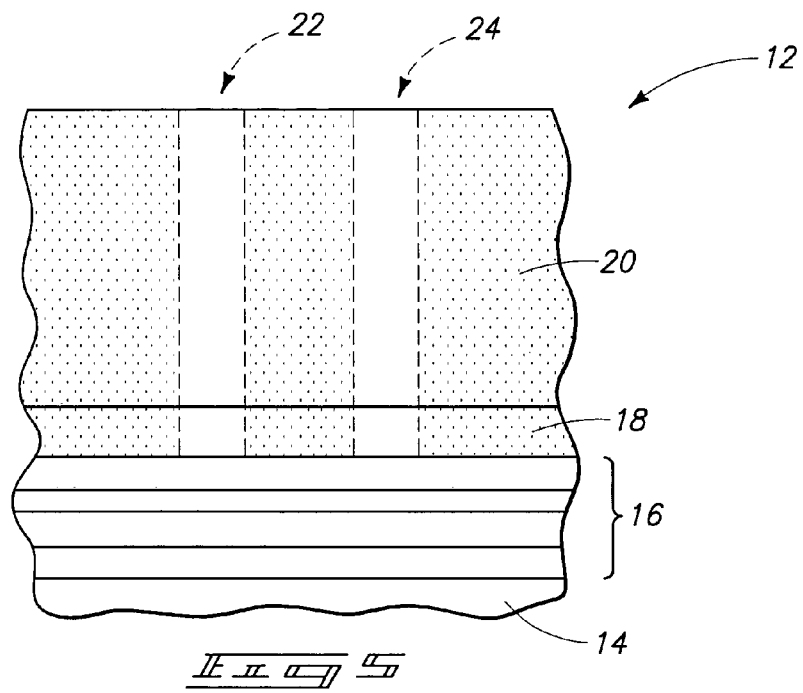
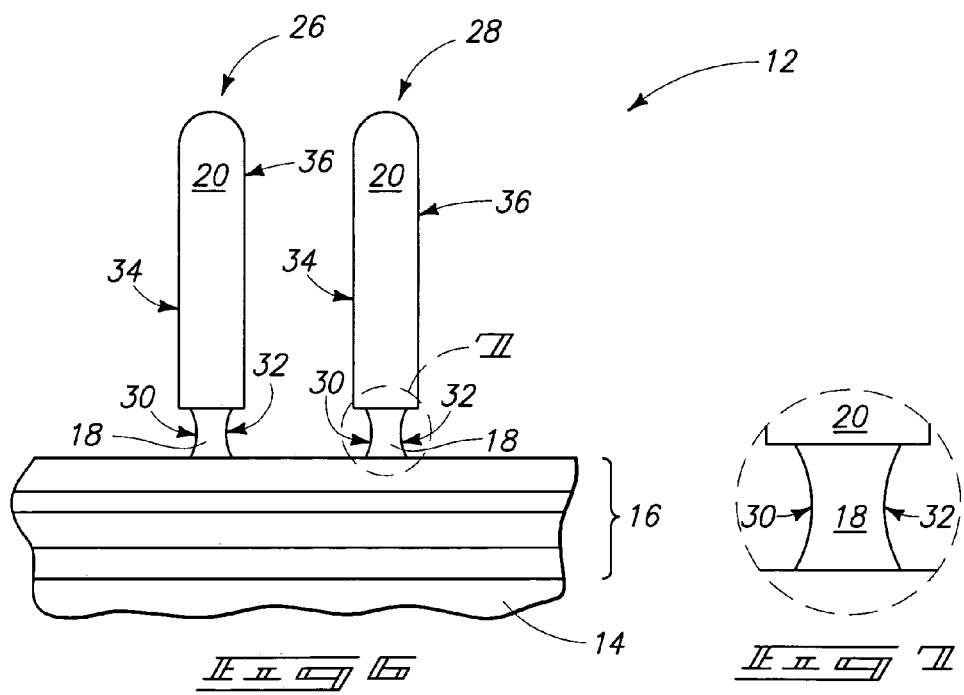

SEMICONDUCTOR PROCESSING PATTERNING METHODS

TECHNICAL FIELD

The present invention relates to semiconductor processing patterning methods and constructions.

BACKGROUND OF THE INVENTION

A continuing goal of semiconductor processing is increased miniaturization while maintaining high performance. Modern semiconductor processes are heavily reliant on photolithography when preparing semiconductors to achieve this goal.

Photolithography typically involves the following steps. Initially, a layer of resist is formed over a substrate. A reticle/mask is subsequently placed above the resist and radiation is allowed to pass through openings of the reticle/mask and contact the resist in patterns defined by the reticle/mask. Depending on whether the resist is a negative resist or a positive resist, the radiation renders exposed portions of the resist more or less soluble in a solvent relative to unexposed portions. The solvent is subsequently utilized to remove the more soluble portions of the resist while leaving the less soluble portions as a patterned mask. The mask pattern can be transferred to the underlying substrate with a suitable etch. Exemplary methods of prior art photolithography and a problem therewith are illustrated in FIGS. 1-3.

Referring first to FIG. 1, a semiconductor substrate 1 at one stage of semiconductor processing is shown that includes a bulk substrate 3, multilayers 4 (e.g., conductive, semiconductive and/or insulative layers) and a resist 5. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Referring to FIG. 2, photoresist layer 5 has been processed to form masking blocks 7. It would be desirable that these masking blocks be of constant respective width in the illustrated cross-section from top to bottom. However in certain instances, the patterned photoresist tends to flare out at the bottoms/bases, as shown, forming what are commonly referred to as "footing", depicted by feet 9.

Referring to FIG. 3, layers 4 have been etched using blocks 7 as an etch mask. As shown, feet 9 have functioned as part of that mask making the pattern of layers 4 substantially wider than the predominate width of blocks 7. In many instances, this is undesirable and/or difficult to predict or control.

SUMMARY OF THE INVENTION

The invention includes semiconductor processing patterning methods and semiconductor constructions. In one implementation, a semiconductor processing patterning method includes forming a second composition resist layer over a different first composition resist layer. Overlapping portions of the first and second composition resist layers are exposed to actinic energy effective to change solubility of the exposed portions versus the unexposed portions of each of the first and second composition resist layers in a developer solution. The first and second composition resist layers are developed with the developer solution under conditions effective to remove the exposed portions of the first composition resist layer at a faster rate than removing the exposed portions of the second composition resist layer.

In one implementation, a semiconductor construction includes a semiconductor substrate having a patterned resist mask received thereon. The resist mask includes a first composition resist portion and a different second composition resist portion received over the first composition resist portion. The first composition resist portion has opposing sidewalls in at least one cross section and the second composition resist portion has opposing sidewalls in the one cross section. At least a portion of the opposing sidewalls of the first composition resist portion are recessed laterally inward of at least a portion of the opposing sidewalls of the second composition resist portion.

Additional aspects and implementations are contemplated.

BRIEF DESCRIPTION OF THE DRAWINGS

Preferred embodiments of the invention are described below with reference to the following accompanying drawings

FIG. 5 is a view of the FIG. 4 construction shown at a processing step subsequent to that of FIG. 4.

FIG. 6 is a view of the FIG. 5 construction shown at a processing step subsequent to that of FIG. 5.

FIG. 7 is an enlarged view of a portion of the FIG. 6 construction.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
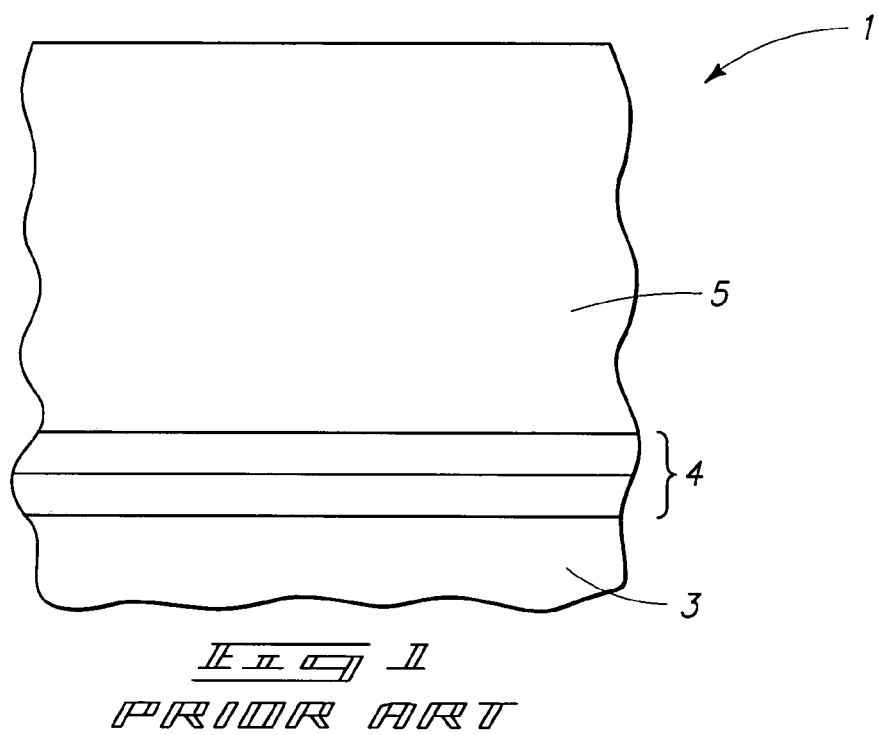
FIG. 1 is a diagrammatic cross-sectional view of a prior art semiconductor construction at one stage of processing.
Figure 2:
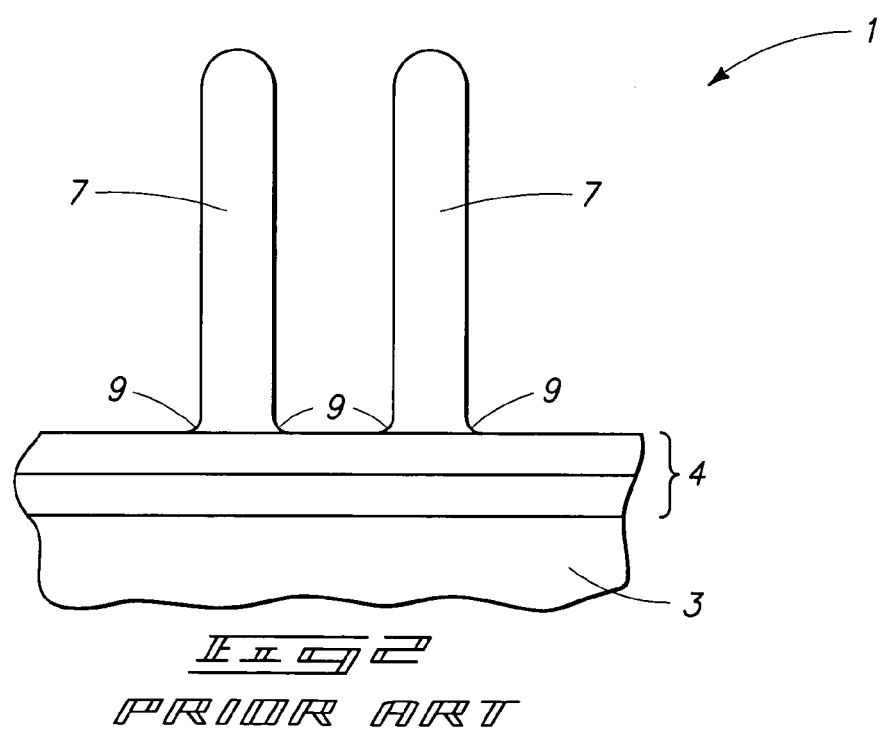
FIG. 2 is a view of the FIG. 1 construction shown at a processing step subsequent to that of FIG. 1.
Figure 3:
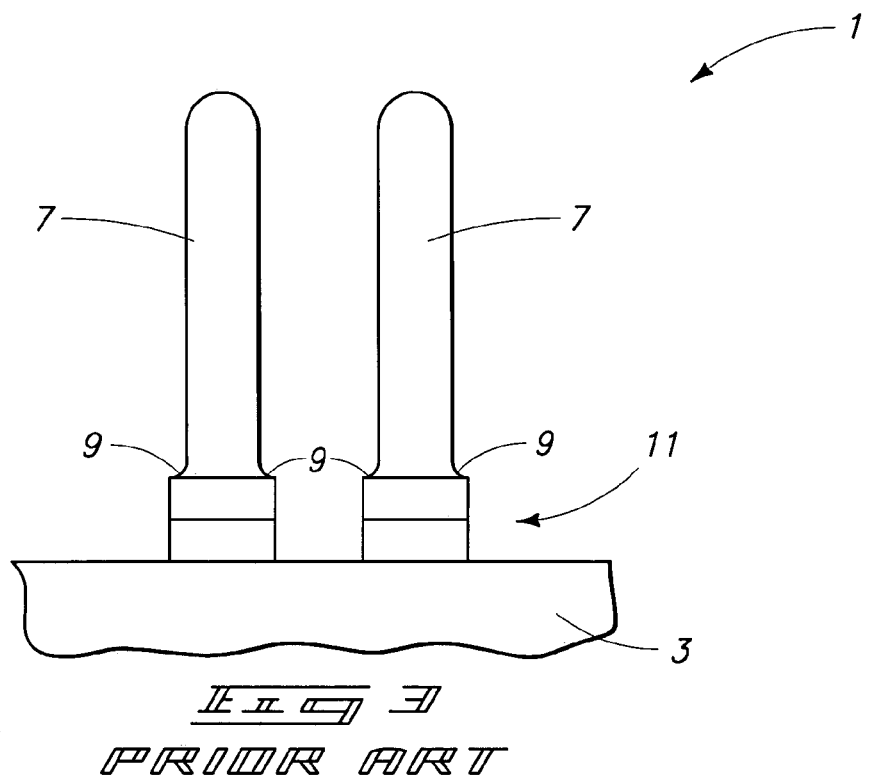
FIG. 3 is a view of the FIG. 2 construction shown at a processing step subsequent to that of FIG. 2.
Figure 4:
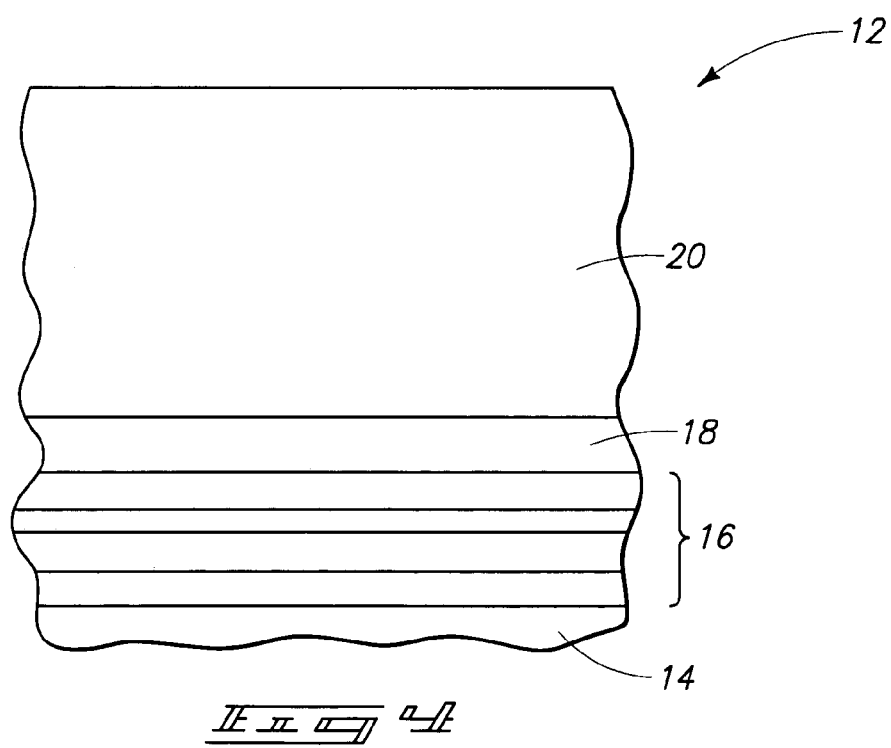
FIG. 4 is a diagrammatic cross-sectional view of a semiconductor construction in accordance with an aspect of the present invention at one stage of processing.

An exemplary semiconductor processing patterning method, in accordance with some aspects of the invention, is described with reference to FIGS. 4-8. Referring to FIG. 4, a wafer fragment 12 includes a bulk semiconductor substrate material 14, for example monocrystalline silicon. Of course other substrates, for example semiconductor-on-insulator substrates and other substrates whether existing or yet-to-be developed, could be utilized. One or more series of layers 16 are formed over material 14 for patterning. A first layer of resist 18 is formed over substrate 16/14. Resist layer 18 might be photosensitive or otherwise impacted by actinic energy (for example UV radiation, e-beam or other actinic energy) to change solubility of exposed versus unexposed portions in a suitable developer solution. Further, resist layer 18 might be a positive resist or a negative resist. In one implementation, the first layer of resist layer 18 is photosensitive to electromagnetic radiation at no greater than about 325 nm. By way of example, an exemplary thickness for layer 18 is less than about 700 Å.

A second layer of resist 20 is formed over first layer of resist 18. As shown in one implementation, second layer of resist 20 is formed "on" (meaning in direct physical contact) with first layer of resist 18. First layer of resist 18 and second layer of resist 20 can be of different compositions at least as initially formed. Further, second layer of resist 20 might be a positive resist or a negative resist.

In one implementation, resist layers 18 and 20 are both positive resist with layer 18 being provided to have a greater solubility in a developer solution than does second positive resist layer 20 at least after exposure to actinic energy effective to increase the solubility of each of the first and second positive resist layers in the developer solution. An exemplary material for first layer of resist 18 includes 1-methoxy-2-propanol, while an exemplary material for second layer of resist 20 includes cyclohexanone and 2-heptanone. An exemplary developer solution for such materials includes tetramethyl ammonium hydroxide (TMAH).

Regardless of whether positive or negative resist are utilized, exemplary ways of modifying the erosion rate or the etch rate of a resist include adding to, subtracting from, or varying the composition of any of the components within the resist. For example, the use of, and/or type of resins, stabilizers, photoactive agents, polymers, molecular weight distribution, etc., can have an impact on the erosion or etch rate of a resist as is known and determined by people of skill in the art.

By way of example only, a specific exemplary positive resist material for first layer of resist 18 is SEPR-402 available from Shin-Etsu Chemical Company of Chiyoda-ku, Tokyo. Such is understood to include 1-methoxy-2-propanol, ethyl lactate and one or more proprietary components. After suitable exposure to actinic energy and development in a 21° C., 2.26 N/2.25% by weight TMAH in $H_2O$ developer solution, SEPR-402 has an erosion or etch rate of about 500 Angstroms per minute.

Another example for first layer of resist 18 is M230Y available from the JSR Corporation of Sunnyvale, Calif. Such is understood to include 1-methoxy-2-propanol, ethyl lactate and various proprietary components. In the same developer solution described above, such has an erosion rate of about 300 Angstroms per minute. With such exemplary different etch rates, the M230Y might be used as an exemplary material for second layer of resist 20, with material SEPR-402 used as an exemplary material for first layer of resist 18. However, in certain circumstances it may be beneficial to utilize a material having an even slower etch rate for second layer of resist 20. By way of example only, such includes AR-360S manufactured by the JSR Corporation. Such is understood to include cyclohexanone, 2-heptanone and at least three proprietary components. Such material has an erosion or etch rate after exposure and development in the above developer solution of approximately 50 Angstroms per minute.

Other layers of resist and/or with other non-resist layers might also be utilized. For example, multi-level resist which typically combines resist and non-resist layers might be utilized. Regardless, in one preferred implementation, first layer of resist 18 has a thickness which is less than a total thickness of all layers received above it. In one implementation, first layer of resist 18 has a thickness which is less than or equal to about 50% (more preferably 25%, even more preferably 10%, and still more preferably 5%) of the total thickness of first layer of resist 18 and all layers received over first layer of resist 18. Further for example where the only other layer received above first layer of resist 18 is second layer of resist 20, the above-referred relationships apply relative to the thickness of second layer of resist 20.

Referring to FIG. 5, overlapping portions of first resist layer 18 and second resist layer 20 have been exposed to actinic energy effective to change solubility of the exposed portions versus the unexposed portions of each of the first and second resist layers 18 and 20 in a developer solution. For example, such could be conducted using a photolithographic mask/reticle, or by any other existing or yet-to-be developed techniques. In the particular illustrated and described implementation, the first and second layers of resist are both positive resists, and the illustrated overlapping portions 22 and 24 are masked while the remaining portions of layers 18 and 20 would be exposed to effectively increase their solubility in a developer solution. Of course, negative resist could be utilized where the opposite relationship would occur.

Referring to FIG. 6, first layer of resist 18 and second layer of resist 20 are developed with a suitable developer solution to form mask patterns 26 and 28 which comprise the first and second resist layers. In one implementation, the developing solution removes or etches the exposed portions, for example those exposed in FIG. 5, of first layer of resist 18 at a rate that is faster than the exposed portions of second layer of resist 20. Regardless, first resist layer 18 of the respective mask patterns 26 and 28 has respective opposing sidewalls 30 and 32 in at least one cross-section, for example that illustrated by FIG. 6. Further in one implementation, second resist layer 20 of the respective mask patterns 26 and 28 has respective opposing sidewall 34 and 36 in the one cross-section. As shown, at least a portion of opposing sidewalls 30 and 32 of first resist layer 18 are received laterally inward of at least a portion of opposing sidewalls 34 and 36 of second resist layer 20 in the one cross-section. As shown, the entirety of the opposing sidewalls 30 and 32 of first resist layer 18 in the one-cross-section are recessed laterally inward of opposing sidewalls 34 and 36 of second resist layer 20 in the one cross-section (FIGS. 6 and 7).

In one implementation, the opposing sidewalls of the first resist layer and the opposing sidewalls of the second resist layer are of different shapes in the one cross-section. For example and by way of example only, opposing sidewalls 34 and 36 of second resist layer 20 are generally straight along a substantial portion of their length, while opposing sidewalls 30 and 32 of first resist layer 18 are not. Further in one implementation, opposing sidewalls 30 and 32 of first resist layer 18 are at least partially curved in the one cross-section, with FIGS. 6 and 7 showing such sidewalls as being curved about their substantial entire lengths.

In addressing the issue or problem identified in the Background section above, one goal or object might be to reduce or eliminate the described footing. Where reduced footing or footing elimination occurs, a possible non-limiting theory is that one or both of the sidewall recessing, or faster etching rate of the first layer of resist, provides for the attack of any forming foot from underneath the foot as well as to a greater degree from its sides. The prior art processes may essentially be limited to the attack of only the top of the foot by developer solutions.

Figure 8:
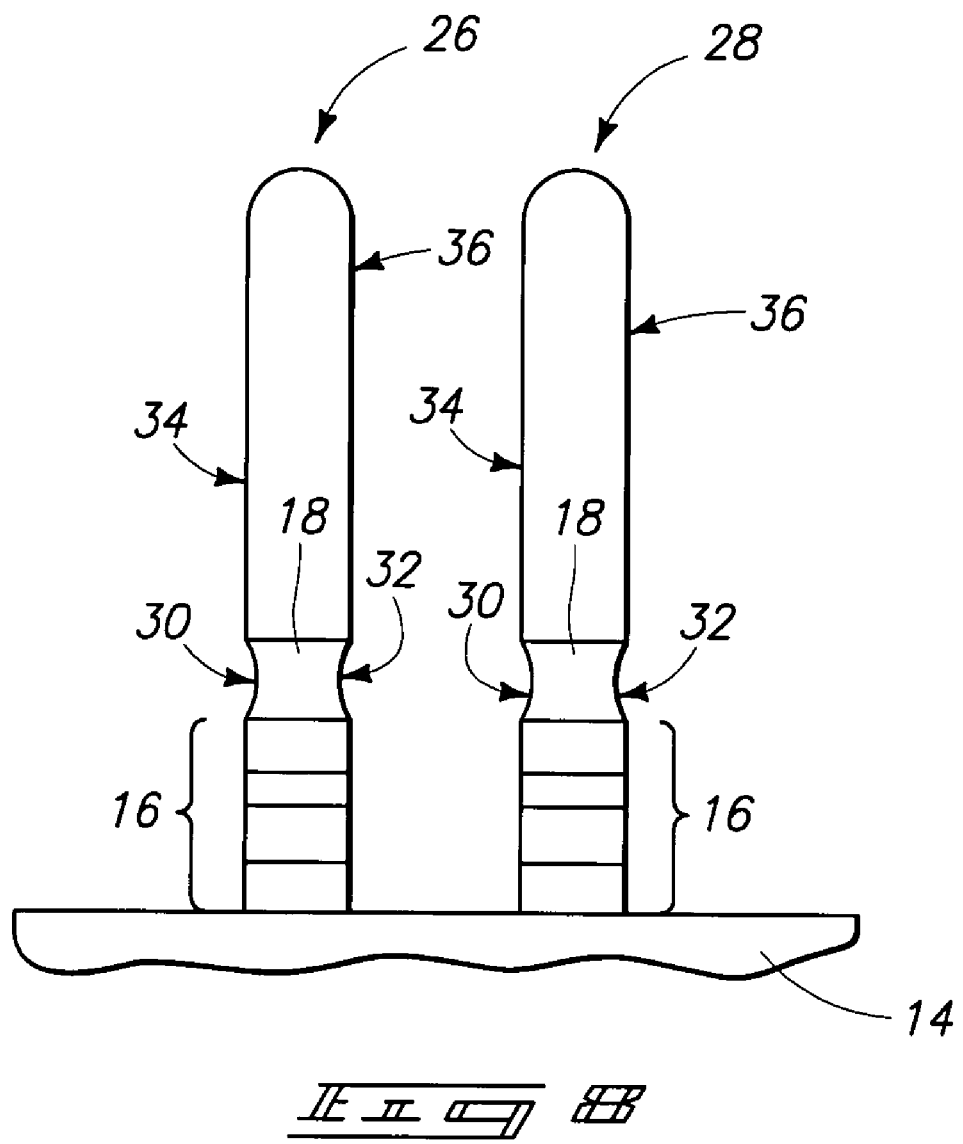
FIG. 8 is a view of the FIG. 6 construction shown at a processing step subsequent to that of FIG. 6.

Referring to FIG. 8, material 16 of substrate 12 has been etched using mask patterns 26 and 28 as a mask. The artisan would, of course, select a suitable chemistry or chemistries in etching material 16, and at least some of one or more of resist materials 20 and 18 might also be etched to some degree in the process.

In one aspect, the invention also contemplates a semiconductor construction independent of the exemplary above-described methods. Such a construction comprises a semiconductor substrate having a patterned resist mask received thereon, for example as shown in FIG. 6. The resist mask comprises a first composition resist portion and a different second composition resist portion received over the first composition resist portion. The first composition resist portion has opposing sidewalls in at least one cross-section, and the second composition resist portion has opposing sidewalls in the one cross-section. At least a portion of the opposing sidewalls of the first composition resist portion are recessed laterally inward of at least a portion of the opposing sidewalls of the second composition resist portion. Exemplary and preferred attributes of the resist mask, first composition resist portion, second composition resist portion, and opposing sidewalls are as described above with respect to the methodical aspects.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor processing patterning method, comprising:
   forming a first and second resist layers over a surface of a silicon-comprising substrate, the first layer being both beneath the second layer and having a thickness which is less than a thickness of the second resist layer;
   forming a mask pattern over the silicon-comprising substrate, the mask pattern comprising a plurality of pillars comprising the material of the first and second resist layers, wherein individual pillars of the pattern are comprised by:
      the material of the first resist layer defining opposing sidewalls in at least one cross section, the material of the first resist layer extending continuously between the opposing sidewalls of the individual pillar of the mask pattern;
      the material of the second resist layer defining opposing sidewalls in the one cross section, the material of the second resist layer extending continuously between the opposing sidewalls of the individual pillar of the mask pattern; and
      an entirety of the opposing sidewalls of the material of the first resist layer received laterally inward of an entirety of the opposing sidewalls of the material of the second resist layer in the one cross section; and
   etching material of the silicon-comprising substrate using the mask pattern as a mask.

2. The method of claim 1 wherein the first and second resist layers comprise different compositions.

3. The method of claim 1 wherein the first resist layer is photosensitive to electromagnetic radiation at a wavelength of no greater than about 325 nm.

4. The method of claim 1 wherein both the first and second resist layers comprise negative resist.

5. The method of claim 1 wherein both the first and second resist layers comprise positive resist.

6. The method of claim 1 wherein the first resist layer comprises 1-methoxy-2-propanol and ethyl lactate and the second resist layer comprises cyclohexanone and 2-heptanone.

7. The method of claim 1 wherein the first resist layer has a thickness which is less than a total thickness of all layers received over the first resist layer.

8. The method of claim 1 wherein the first resist layer has a thickness which is less than or equal to about 50% of a total thickness of the first resist layer and all layers received over the first resist layer.

9. The method of claim 1 wherein the first resist layer has a thickness which is less than or equal to about 25% of a total thickness of the first resist layer and all layers received over the first resist layer.

10. The method of claim 1 wherein the first resist layer has a thickness which is less than or equal to about 10% of a total thickness of the first resist layer and all layers received over the first resist layer.

11. The method of claim 1 wherein the first resist layer has a thickness which is less than or equal to about 5% of a total thickness of the first resist layer and all layers received over the first resist layer.

12. The method of claim 1 wherein the opposing sidewalls of the first resist layer are at least partially curved in the one cross section.

13. The method of claim 1 wherein the opposing sidewalls of the first resist layer and the opposing sidewalls of the second resist layer are of different shapes in the one cross section.

14. A semiconductor processing patterning method, comprising:
   forming a first positive resist layer over a surface of a silicon-comprising substrate;
   forming a second positive resist layer over the first positive resist layer, the first positive resist layer having a thickness less than the second positive resist layer;
   forming a mask pattern over the silicon-comprising substrate, the mask pattern comprising a plurality of pillars comprising the material of the first and second positive resist layers, wherein individual pillars of the pattern are comprised by:
      the material of the first positive resist layer defining opposing sidewalls in at least one cross section, the material of the first positive resist layer extending continuously between the opposing sidewalls of the material of the first positive resist layer of the individual pillar;
      the material of the second positive resist layer defining opposing sidewalls in at least the one cross section, the material of the second positive resist layer extending continuously between the opposing sidewalls of the material of the second positive resist layer of the individual pillar; and
      at least a portion of the opposing sidewalls of the material of the first positive resist layer of the mask pattern are recessed laterally inward of at least a portion of opposing sidewalls of the material of the second positive resist layer in the one cross section; and
   etching material of the silicon-comprising substrate using the mask pattern as a mask.

15. The method of claim 14 wherein the first positive resist layer is photosensitive to electromagnetic radiation at a wavelength of no greater than about 325 nm.

16. The method of claim 14 wherein the second positive resist layer is formed on the first positive resist layer.

17. The method of claim 14 wherein the first positive resist layer comprises 1-methoxy-2-propanol and the second positive resist layer comprises cyclohexanone and 2-heptanone.

18. The method of claim 14 wherein the first positive resist layer has a thickness which is less than a total thickness of all layers received over the first positive resist layer.

19. The method of claim 14 wherein the first positive resist layer has a thickness which is less than about 5% of a total thickness of the first positive resist layer and all layers received over the first positive resist layer.

20. The method of claim 14 wherein the opposing sidewalls of the first positive resist layer are at least partially curved in the one cross section.

21. The method of claim 14 wherein an entirety of the opposing sidewalls of the first positive resist layer are recessed laterally inward of the opposing sidewalls of the second positive resist layer in the one cross section.

* * * * *